United States Patent [19]

Kuriyama

[11] 4,351,714
[45] Sep. 28, 1982

[54] SPUTTER-ETCHING DEVICE

[75] Inventor: Noboru Kuriyama, Yokohama, Japan

[73] Assignee: Kabushiki Kaisha Tokuda Seisakusho, Kanagawa, Japan

[21] Appl. No.: 256,033

[22] Filed: Apr. 21, 1981

[30] Foreign Application Priority Data

Apr. 30, 1980 [JP] Japan ................................. 55-57466

[51] Int. Cl.³ ............................................. C23C 15/00
[52] U.S. Cl. ................................. 204/298; 204/192 C; 204/192 E
[58] Field of Search ............................ 204/298, 192 E

[56] References Cited

U.S. PATENT DOCUMENTS

| | | | |
|---|---|---|---|
| 3,180,751 | 4/1965 | Law | 204/192 E |
| 3,502,562 | 3/1970 | Humphries | 204/298 |
| 4,062,319 | 12/1977 | Roth et al. | 204/298 |
| 4,126,530 | 11/1978 | Thornton | 204/192 EC |
| 4,204,942 | 5/1980 | Chabroudi | 204/298 |
| 4,265,730 | 5/1981 | Hirose et al. | 204/298 |
| 4,268,374 | 5/1981 | Lepselter | 204/298 |
| 4,274,936 | 6/1981 | Love | 204/298 |

OTHER PUBLICATIONS

Robert W. Berry et al., Thin Film Technology, Van Nostrand Reinhold Co., New York, 1968 pp. 200-201.

Primary Examiner—Veronica O'Keefe
Attorney, Agent, or Firm—Koda and Androlia

[57] ABSTRACT

A sputter-etching device has a hollow electrode with an internal space in which gas plasma is formed and an opening which is confronted with the inner wall of a vacuum chamber to provide an electric discharge gap therebetween. An object to be processed is placed on the side of the vacuum chamber instead of the side of the electrode. The sputter-etching device is combined with a sputtering device so that immediately after being cleaned by sputter-etching, the object is subjected to sputtering.

10 Claims, 12 Drawing Figures

SPUTTER-ETCHING DEVICE

BACKGROUND OF THE INVENTION

This invention relates to sputter-etching device utilizing radio-frequency discharge.

For instance in a vacuum evaporation process, sputter-etching is carried out in order to clean a surface to be vacuum-evaporated.

A conventional sputter-etching device of this type is as shown in FIG. 1. A flat-plate-shaped electrode 2 is placed in a vacuum chamber 1. An object 3 to be processed is put on the electrode 2. Radio-frequency discharge is then effected between the electrode 2 and the vacuum chamber 1, so that gas ions such as argon ions are formed in the vacuum chamber 1 by the utilization of the rectification action of the discharge, to subject the object 3 to sputter-etching.

The flat-plate-shaped electrode 2 is electrically insulated by insulating members 4 from the vacuum chamber 1, and is surrounded by a dark space shield 5. The electrode 2 is connected to a radio-frequency power source 10 through a circuit made up of a direct current blocking capacitor 6, a matching coil 7 and a matching capacitor 8, and through a radio-frequency cable 9. The device further comprises a shield 11 for preventing a radio-frequency leakage from the circuitry. The gas in a gas cylinder 12 is supplied through a needle valve 13 into the vacuum chamber 1.

When the radio-frequency discharge is effected in the device, the gas in the vacuum chamber 1 is ionized. The gas ions impinge on the flat-plate-shaped electrode 2; that is, the gas ions sputter the surface of the object 3 to be processed, so that the surface of the object 3 is cleaned.

However, the conventional device suffers from the following drawbacks:

One of the drawbacks is that, upon sputtering, the surface material of the object 3 is scattered around to stick to the inner wall of the vacuum chamber 1. Therefore, it is necessary to clean the vacuum chamber 1; however, it is considerably troublesome and difficult to clean the vacuum chamber, because the latter must be handled with great care. In addition, in the case where a sputter-etching device and a sputtering device are juxtaposed, i.e. a device is so formed that a sputter-etching process and a sputtering process are carried out in succession, it is necessary to segregate the sputter-etching section of the device from the sputtering section.

A second drawback is that the device suffers from an end effect. An etching rate is high at the ends of the flat-plate-shaped electrode 2, while it is low at the central portion of the electrode 2, as shown in FIG. 2. As is apparent from FIG. 2, in each end portion of the electrode 2 the etching rate is greatly changed even if the electrode position is changed only slightly; and on the other hand, the etching rate is considerably low in the central portion of the electrode where the etching rate is constant. Since it is necessary that the entire surface of an object to be processed is uniformly etched, the central portion of the electrode is used in the etching process; however, this method is undoubtedly low in efficiency.

A third drawback is that it is difficult to carrying out the etching process while an object to be processed is being moved, i.e. it is considerably difficult to move the electrode 2 on which the object is placed.

SUMMARY OF THE INVENTION

Accordingly, an object of this invention is to provide a sputter-etching device in which all of the above-described drawbacks accompanying a conventional sputter-etching device have been eliminated.

Another object of the invention is to provide a sputter-etching device in which, when an abnormal electric discharge occurs, the operation of its high frequency electric source is suspended to stop the abnormal electric discharge.

The foregoing objects and other objects as well as the specific features of the invention will become more apparent from the following detailed description and the appended claims when read in conjunction with the accompanying drawings.

DETAILED DESCRIPTION OF THE INVENTION

Figure 1:
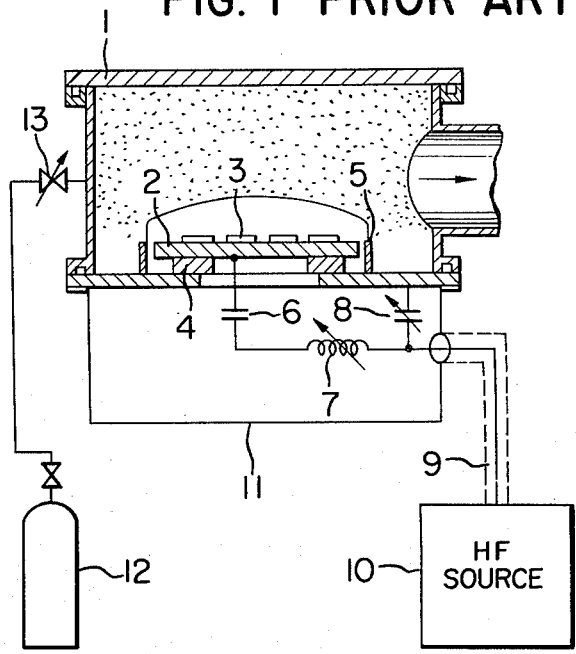
FIG. 1 is an explanatory diagram showing the arrangement of a conventional radio-frequency discharge type sputter-etching device.
Figure 3:
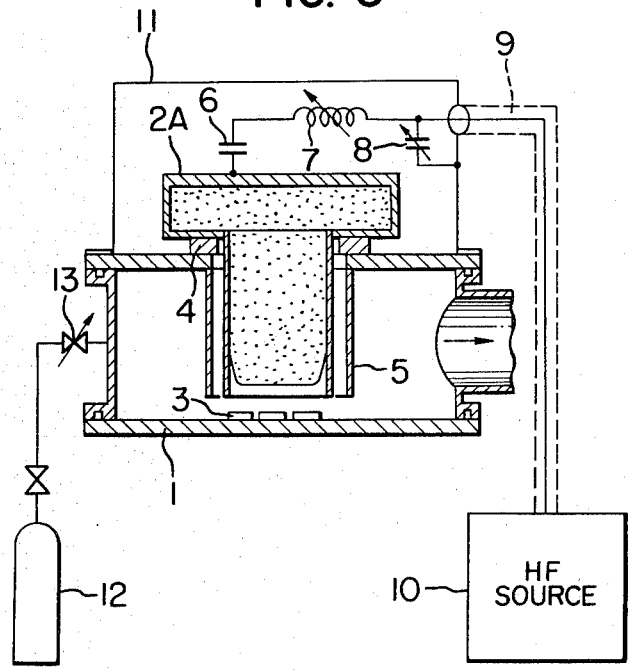
FIG. 3 is an explanatory diagram showing one example of a sputter-etching device according to the invention.

A first example of a sputter-etching device according to this invention is as shown in FIG. 3, in which those components which have been previously described with reference to FIG. 1 are therefore similarly numbered.

The device in FIG. 3 is different from one described with reference to FIG. 1 in an electrode 2A. The electrode 2A is a hollow one having an internal space, and it is secured to the wall of the vacuum chamber 1, as shown in FIG. 3.

As well known in the art, the generation of an electric discharge depends greatly on the configuration of an electrode. The hollow electrode 2A of the device of the invention has an opening which faces the inner wall of the vacuum chamber 1 so as to form a discharge gap therebetween. Therefore, the discharge phenomenon in the device is considerably difference from the discharge phenomenon which occurs with the conventional sputter-etching device in which the flat-plate-shaped electrode is placed in the vacuum chamber as shown in FIG. 1. That is, in the case of FIG. 1, a dark space is provided immediately above the flat-plate-shaped electrode 2, so that a plasma gas created is away from the electrode 2. On the other hand, in the device of the invention, a plasma gas is formed inside the hollow electrode 2A and a dark space is provided on the side of the vacuum chamber 1.

For this reason, in the device of FIG. 1, an object 3 to be processed is placed on the flat-plate-shaped electrode 2, while in the device of the invention an object 3 to be processed is placed on the side of the vacuum chamber 1 as shown in FIG. 3. In addition, in the case of FIG. 1 the sputter-etching is carried out when the potential of the electrode 2 becomes negative; in other words, when the electrode 2 has the negative potential, the gas ions are attracted towards the electrode 2 to impinge on the object 3. On the other hand, in the device of the invention shown in FIG. 3, the sputter-etching is carried out when the potential of the vacuum chamber becomes negative.

A plasma gas is created in the cavity of the hollow electrode 2A, as described before. Therefore, it is essential that the cavity is suitable in size. In order to provide this suitable size, in the first example of the device shown in FIG. 3 a drum-shaped member is coupled to a cylindrical member with an opening. One reason why the drum-shaped member is employed is that the volume of the cavity of the electrode can be increased without increasing the height (in a vertical direction in FIG. 3) of the electrode. Another reason is that the electrode 2A can be supported through an insulating member 4 on the vacuum chamber if the sidewardly extended portion of the drum-shaped member of the electrode is used. A third reason is that the stray capacitance between the electrode 2A and a dark space shield 5 or between the electrode 2A and the vacuum chamber 1 can be minimized. If this stray capacitance is large, then in the application of radio-frequency current between the electrode 2A and the vacuum chamber 1 the impedance characteristic is adversely affected. Thus, it is essential to minimize the stray capacitance. Accordingly, the configuration of the electrode 2A is not always limited to that shown in FIG. 3. That is, it can be determined as desired by taking into account the volume of the cavity of the electrode, the supporting structure of the electrode and the stray capacitance around the electrode.

Figure 4:
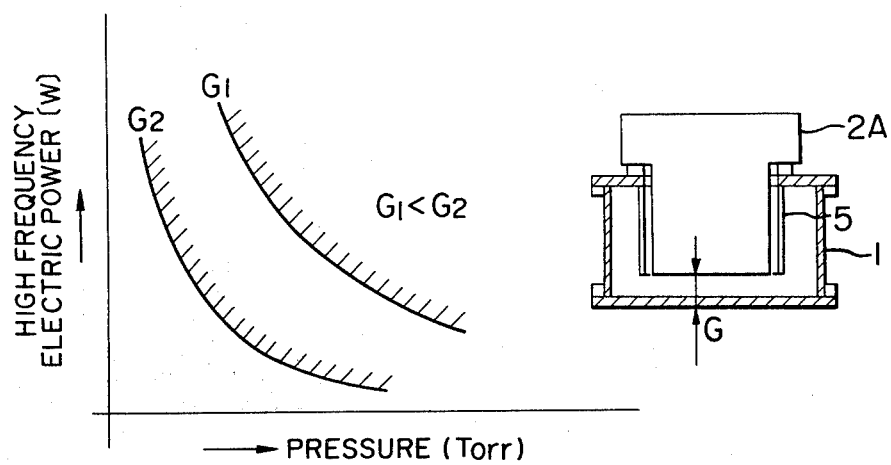
FIG. 4 is a graphical representation indicating characteristic curves for a description of the conditions which should be taken into account in connection with the starting operation of the device of the invention.

FIG. 4 is a graphical diagram indicating radio-frequency power with vacuum chamber pressure, for a description of the conditions which should be taken into consideration for starting the device in FIG. 3, i.e. for starting the electric discharge therein. The graph of FIG. 4 shows two characteristic curves G1 and G2 substantially in the form of hyperbolas. The upper part of each characteristic corresponds to a region in which the electric discharge spreads in the entire vacuum chamber. The reference characters G1 and G2 designating the two characteristic curves means that the characteristic curves are obtained when the discharge gap between the electrode 2A and the vacuum chamber 1 is set to two predetermined values, respectively.

The characteristic curves will be described qualitatively. As the discharge gap is decreased, it becomes difficult for the discharge to spread in the vacuum tube. In the case where the discharge gap is set to a predetermined value, as the vacuum chamber pressure is increased, the applicable radio-frequency power is decreased, and in order to increase the radio-frequency power it is necessary to increase the degree of vacuum in the vacuum chamber.

This characteristic indicates a condition required to stabilize the electric discharge in the device of the invention. However, under this condition, it would be difficult to start the device; i.e. in the device of the invention it is difficult to start the electric discharge merely by applying the radio-frequency voltage. In the case of the conventional device shown in FIG. 1, the discharge can be started by increasing the vacuum chamber pressure. On the other hand, in the device of the invention, it is impossible to employ the method of increasing the vacuum chamber pressure, because the electric discharge spreads in the entire vacuum chamber. If the electric discharge spreads in the vacuum chamber, then the voltage relation is reversed, as a result of which the electrode is etched and accordingly the material of the electrode is deposited on the object to be processed. Accordingly, a novel method must be employed to start the device of the invention.

In this connection, the device of the invention is provided with a discharge starting unit. It has been confirmed that in the device of the invention arranged as described above, the electric discharge is not started even if the electrode voltage is changed, but it is started by injecting electrons having a predetermined energy into the electrode. The sufficient energy of electrons to be injected is 100 eV, 0.1 mA or more. Electrons of this order of energy can be readily obtained by using a small thermion filament. Accordingly, a thermion filament is provided in the hollow electrode 2A, so that the device of the invention can be started by applying current to the thermion filament. After the device has been started, the application of current to the filament can be suspended; that is, the discharge is maintained merely by applying the radio-frequency voltage.

In addition, a method of applying a high voltage to a needle-shaped electrode, or a method of using ultraviolet rays is applicable to starting the device.

The conditions required for stabilizing the electric discharge in the device of the invention is more severe than those required for stabilizing the electric discharge in the conventional device shown in FIG. 1. If the conditions are not satisfied, then the electric discharge will spread in the entire vacuum chamber. This trouble occurs, for instance, where objects to be processed are not equal in dimension and accordingly the discharge gap is increased. Thus, it is necessary to provide a countermeasure against the abnormal discharge.

Figure 5:
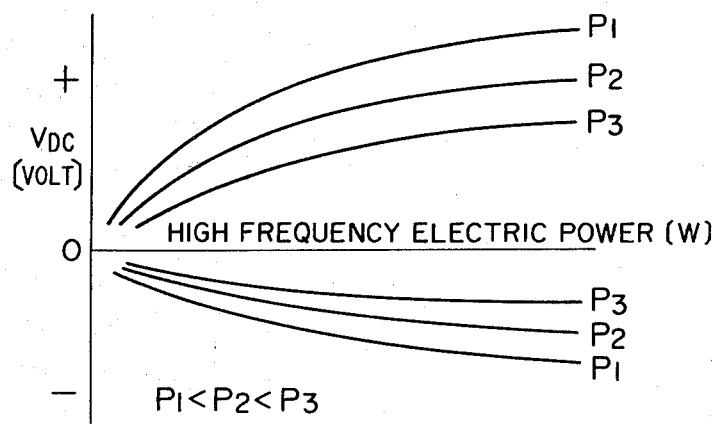
FIG. 5 is a diagram showing characteristics which are utilized for detecting the occurrence of an abnormal electric discharge in the invention.

FIG. 5 shows characteristic curves which are employed to detect the abnormal discharge, in the invention. When the electric discharge takes place in the device of the invention, a DC voltage $V_{DC}$ is developed in the electrode 2A. The DC voltage is positive when the normal discharge takes place; however, it becomes negative when the abnormal discharge takes place, i.e. when the discharge spreads in the vacuum chamber. The radio-frequency voltage is superposed on the DC voltage. Therefore, a pure DC voltage can be obtained by removing the radio-frequency component with a filter. In FIG. 5, reference characters P1, P2 and P3 designate vacuum chamber pressures, respectively. As is clear from FIG. 5, as the vacuum chamber pressure is decreased, the voltage developed is increased. In addition, as the applied radio-frequency power is increased, the voltage developed is increased.

Thus, it can be determined by detecting this DC voltage whether the electric discharge is normal or abnormal. For this purpose, voltage detecting means such as a voltmeter can be employed in such a manner that when the pointer of the voltmeter is deflected to the negative side, the application of the radio frequency power is suspended, to carry out the starting operation all over again. Alternatively, a circuit may be so formed that comparison with a reference voltage is carried out with a comparator, and according to the comparison result the device is automatically started.

Figure 2:
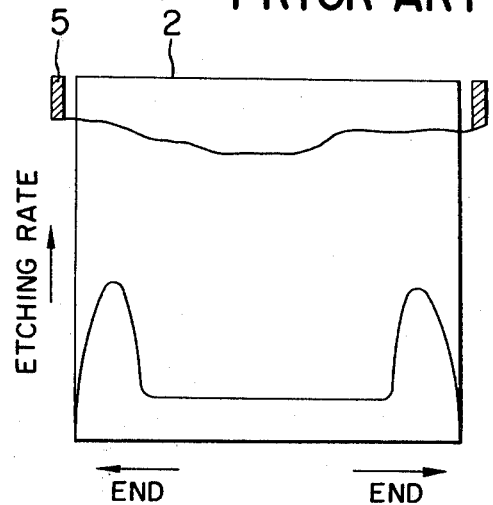
FIG. 2 is an explanatory diagram indicating an end effect in the device in FIG. 1.
Figure 6:
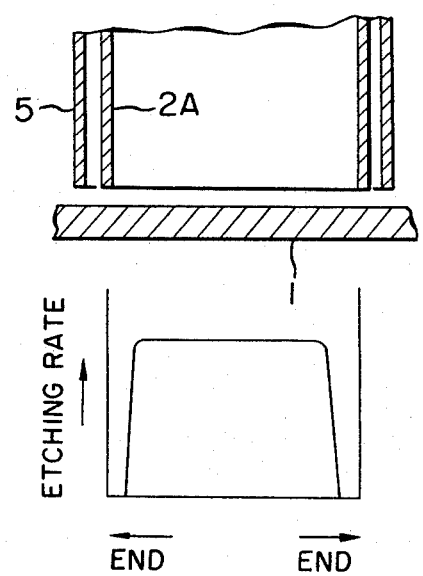
FIG. 6 is an explanatory diagram showing a distribution of the etching made by the device of the invention.

FIG. 6 shows a distribution of the etching made by the device of the invention shown in FIG. 3. As is clear from comparison with FIG. 2, the etching rate is considerably high and uniform except for those in the end portions of the hollow electrode. Accordingly, in the device of the invention, unlike the conventional device, it is unnecessary to use the region low in etching rate. In addition, in the case where an object to be processed is subjected to etching while being moved as described later, the object can be continuously moved. Furthermore, in the case where objects to be processed are placed on a turn table, they can be uniformly processed by forming the opening of the hollow electrode into a sector one. When objects to be processed are conveyed by conveying means such as a belt conveyor, they can be also uniformly processed by forming the opening of the electrode into a square one.

Figure 7:
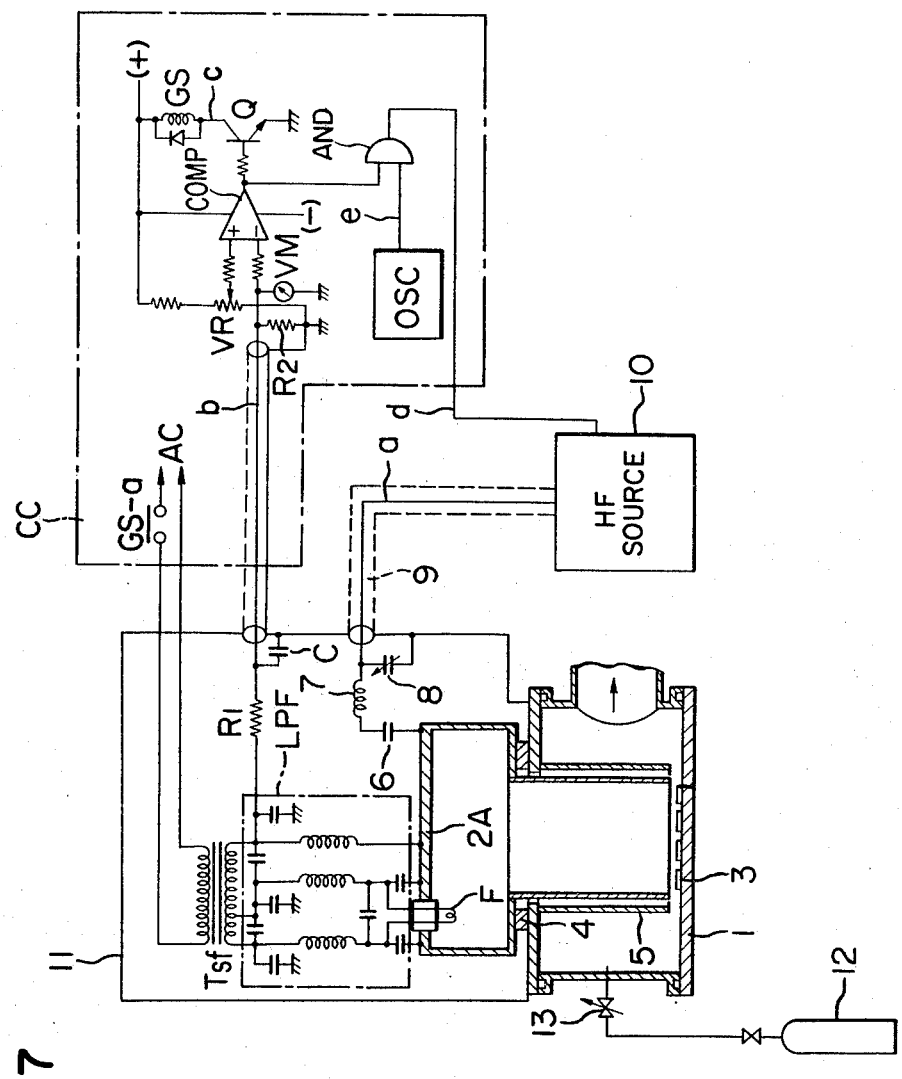
FIG. 7 is a circuit diagram of starter means coupled to the device of the invention.

FIG. 7 shows mainly a circuit of the device of the invention having starter means which can also automatically start the device when an abnormal electric discharge takes place. In FIG. 7, a filament F is provided in the hollow electrode 2A, for starting the device. The filament F is supplied with current through a transformer Tsf from the commercial power source. The transformer Tsf has low voltage taps for supplying current to the filament F, and high voltage taps for applying a relatively high voltage at the commercial frequency between the electrode 2A and the filament F. The taps are connected through a filter LPF to the filament F and the electrode 2A.

The electrode 2A is connected to a voltmeter VM and a comparator COMP in a control circuit CC through a voltage division circuit consisting of the filter LPF and resistors $R_1$ and $R_2$. A reference voltage is applied through a variable resistor VR to the comparator COMP, in which the reference voltage is compared with a voltage from the voltage division circuit, to provide an output. The output of the comparator COMP is applied to a transistor Q to control a glow starter GS. The output of the comparator COMP is also applied to one input terminal of an AND circuit AND, to the other input terminal of which the output of an oscillator OSC is applied, so that the output of the AND circuit controls a radio-frequency electric source 10.

Figure 8:
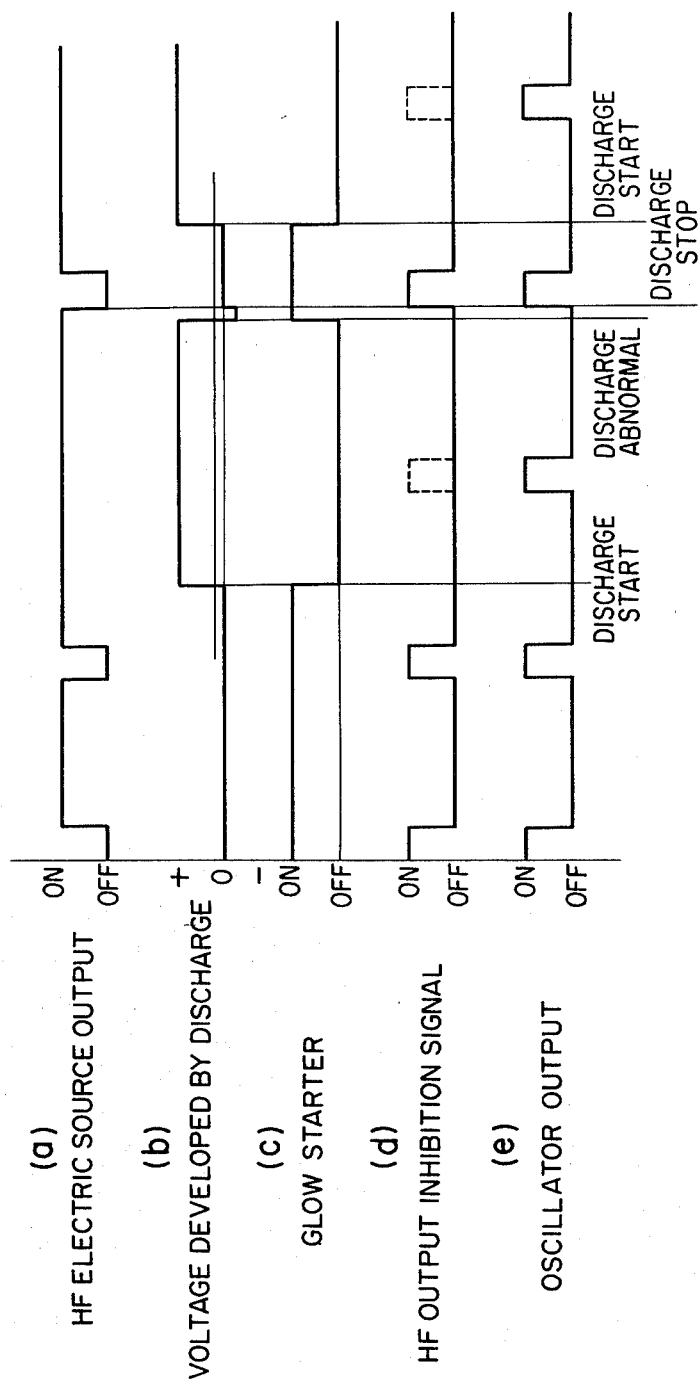
FIG. 8 is a time chart for a description of the operation of the device in FIG. 7; and The parts (a) and (b) of FIG. 9 and the parts (a) and (b) of FIG. 10 are explanatory diagrams showing two examples of the application of the device of the invention.

FIG. 8 is a time chart indicating various signals in the starting circuit shown in FIG. 7. The operation of the circuit in FIG. 7 will be described with reference to FIG. 8. The operation of the circuit is based on the output of the oscillator OSC. The output of the oscillator OSC is a pulse signal with a constant period, and it is directly intended to be used to form a radio-frequency output inhibition signal d. Therefore, the period should be so selected that the pulse occurs no later than the occurrence of an abnormal discharge.

In the case when the output of the comparator COMP has been provided when the oscillator output e is produced, the radio-frequency electric source 10 provides no output, and accordingly no electric discharge is carried out in the sputter-etching device. Therefore, in this case, no DC voltage is developed in the electrode 2A. On the other hand, the output of the comparator COMP is applied to the transistor Q to energize the glow starter GS. As a result, the contact means GS-a of the glow starter GS is closed, so that current is applied through the transformer Tsf to the filament F and the electrode 2A of the sputter-etching device. Thus, the device is started.

The oscillator OSC provides its output for 1 ms and pauses for 10 ms, for instance. Therefore, 1 ms after the provision of the output, the input conditions of the AND circuit AND are not satisfied, and the radio-frequency power inhibition signal d is eliminated. As a result, the radio-frequency electric source output a is provided to be applied to the electrode 2A. However, no DC voltage b is developed in the electrode 2A because it takes a period of time corresponding to 2 to 3 Hz of the commercial power source for the sputter-etching device to start the electric discharge. Accordingly, the glow starter is still maintained in "on" state.

Before the discharge is started, the output of the comparator COMP is continuously applied to the AND circuit AND. Therefore, whenever the output e is provided by the oscillator OSC, the high frequency output inhibition signal d is produced and the output a of the radio-frequency electric source is eliminated.

When the discharge is started, then the DC voltage b is developed in the electrode 2A. As a result, the comparator COMP produces the output, and accordingly the glow starter is turned off. In addition, as one of the inputs to the AND circuit AND is eliminated, no radio-frequency output inhibition signal d is produced. Thus, the discharge is continued.

If, during the discharge operation, an abnormal discharge is caused for some reason, for instance a reduction of the distance between the object 3 and the electrode 2A, a negative DC voltage is developed in the electrode 2A, as a result of which the comparator COMP produces an output to operate the glow starter GS. When, under this condition, the oscillator OSC produces the output, the radio frequency output inhibition signal d is produced, to eliminate the output of radio-frequency electric source, thereby to stop the electric discharge. In this case, as the glow starter is in operation, the sputter-etching device is ready to be restarted, and the electric discharge can take place in the sputter-etching device soon because of the presence of electrons lately produced. Thus, the electric discharge starts soon.

As is apparent from the above description, the starting circuit according to the invention can effectively serve as a countermeasure against the occurrence of an abnormal electric discharge.

Figure 9:
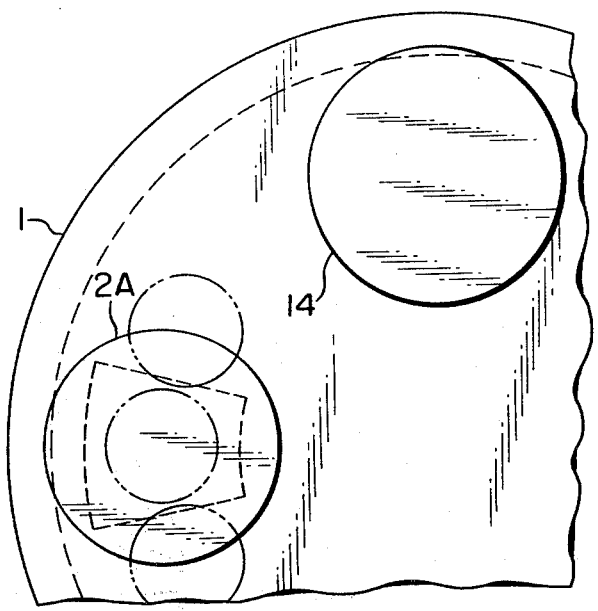
Figure 9:
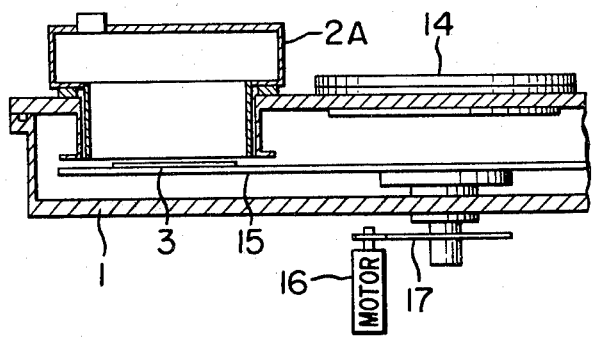

The parts (a) and (b) of FIG. 9 show one example of the application of the device according to the invention. In the example, an object 3 to be processed is placed on a turn table 15 which is driven through a power transmission mechanism 17 by a motor 16. The sputter-etching device of the invention and a sputtering source 14 are arranged along the path of movement of the object 3. Therefore, in this case, immediately after being cleaned by sputter-etching, the object can be subjected to sputtering.

Figure 10:
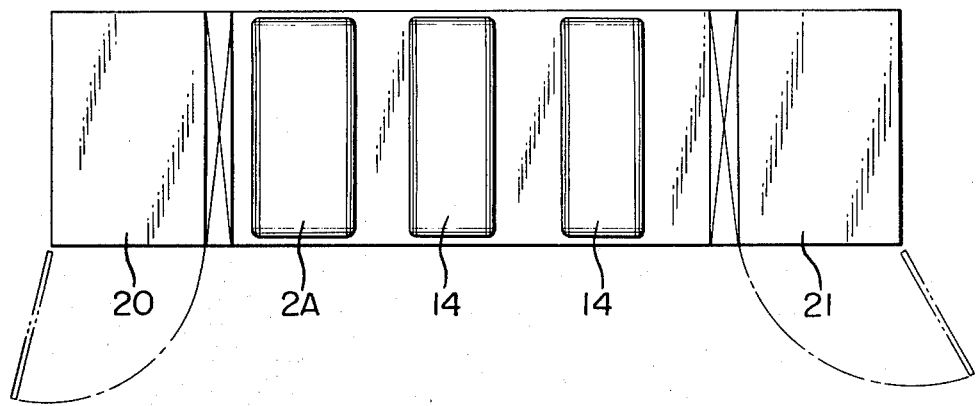
Figure 10:
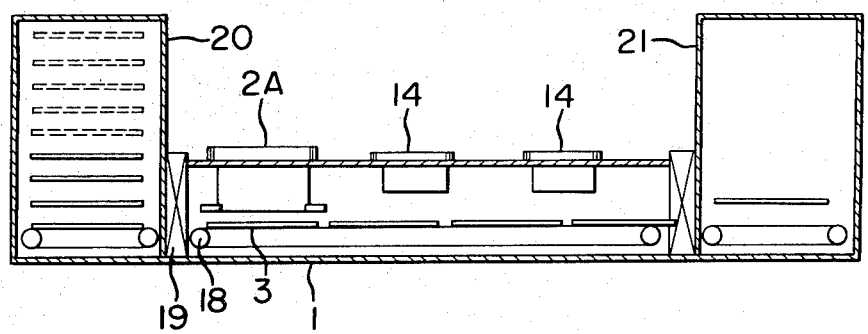

The parts (a) and (b) of FIG. 10 show another example of the application of the device of the invention. In the example, an object 3 to be processed is conveyed straightly by a conveying mechanism 18 such as a belt conveyor, and the sputter-etching device and the sputtering source are arranged along the conveying mechanism, to form a processing device. In the processing device, an auxiliary chamber 20 used before processing and an auxiliary chamber 21 used after processing are disposed through isolating means 19 on both sides.

As is clear from the above description, in the sputter-etching device of the invention, the discharge gap is provided between the opening of the hollow electrode and the inner wall of the vacuum chamber, and the radio-frequency energy is applied between the electrode and the vacuum chamber. Therefore, in the device of the invention, unlike the conventional device, in which the flat-plate-shaped electrode is placed in the vacuum chamber, the potential of the vacuum chamber side is negative, so that sputter-etching can be carried out with an object to be processed on the vacuum chamber side. The vacuum chamber can be readily coupled to the radio-frequency electric source, and the mechanism for moving an object to be processed can be readily provided in the vacuum chamber. Thus, the sputter-etching device of the invention can be readily handled.

What is claimed is:

1. A sputter-etching device which comprises:
    a vacuum chamber filled with a predetermined gas under a pressure substantially equal to a vacuum pressure;
    a hollow electrode having an internal space and an opening, said electrode being mounted on a wall of said vacuum chamber in such a manner that an electric discharge gap is formed between said opening and an inner wall of said vacuum chamber;
    a radio-frequency electric source for applying a radio-frequency voltage between said electrode and said vacuum chamber; and
    discharge starting means for starting an electric discharge between said electrode and said vacuum chamber,
    thereby to subject an object to be processed to sputter-etching.

2. A device as claimed in claim 1, in which said object is placed on the side of said vacuum chamber.

3. A device as claimed in claim 1, in which said electrode is made up of a cylindrical member and a drum-shaped member which are combined together, so that the space volume of said electrode is large when compared with the height of said electrode.

4. A device as claimed in claim 1, in which said discharge starting means is a thermion filament provided in said vacuum chamber.

5. A device as claimed in claim 1, which further comprises:
    a control circuit for controlling said radio-frequency electric source in such a manner that said control circuit detects a d.c. voltage developed in said electrode when abnormal electric discharge occurs in said vacuum chamber, to eliminate an output of said radio-frequency electric source thereby to stop the abnormal electric discharge.

6. A device as claimed in claim 1, which further comprises:
    conveying means for moving an object to be processed, said conveying means being provided in said vacuum chamber.

7. A device as claimed in claim 6, in which said conveying means is a turn table on which said object is placed.

8. A device as claimed in claim 7, which is combined with a sputtering source in such a manner that said sputter-etching device and said sputtering source are arranged along the path of movement of said object, whereby immediately after being cleaned by sputter-etching, said object is subjected to sputtering.

9. A device as claimed in claim 6, in which said conveying means is a belt conveyer on which said object is placed.

10. A device as claimed in claim 9, which is combined with a sputtering source in such a manner that said sputter-etching device and said sputtering source are arranged along said belt conveyor, whereby immediately after being cleaned by sputter-etching, said object is subjected to sputtering.

* * * * *